United States Patent [19]

Kataoka et al.

[11] 4,047,199

[45] Sept. 6, 1977

[54] SEMICONDUCTOR DEVICE

[75] Inventors: Shoei Kataoka, Tanashi; Yasuo Komaniya, Kikuna; Nobuo Hashizume, Higashikurume; Kazutaka Tomizawa, Kamagaya; Mitsuo Kawashima, Tokorozawa, all of Japan

[73] Assignee: Agency of Industrial Science & Technology, Tokyo, Japan

[21] Appl. No.: 618,554

[22] Filed: Oct. 1, 1975

Related U.S. Application Data

[60] Division of Ser. No. 417,300, Nov. 19, 1973, abandoned, which is a continuation of Ser. No. 165,636, July 23, 1971, abandoned.

[30] Foreign Application Priority Data

July 23, 1970   Japan ................................. 45-63955
Feb. 27, 1971   Japan ................................. 46-9661

[51] Int. Cl.$^2$ .................... H01L 27/26; H01L 47/00
[52] U.S. Cl. ........................................ 357/3; 307/206; 307/216; 307/217; 357/15; 357/19; 357/30; 357/55
[58] Field of Search ................. 331/107 G; 357/3, 19, 357/30; 307/206, 216, 217

[56] References Cited

U.S. PATENT DOCUMENTS

| 3,439,236 | 4/1969  | Blicher ........................ 357/3 |
| 3,538,400 | 11/1970 | Yanai et al. ................. 357/3 |
| 3,544,914 | 12/1970 | Suga ............................ 357/3 |
| 3,599,000 | 8/1971  | Yanai et al. ................. 357/3 |
| 3,651,423 | 3/1972  | Sewell ......................... 357/3 |

OTHER PUBLICATIONS

Chang, IBM Tech. Discl. Bull., vol. 12, No. 1, June 1969, pp. 6-8.

*Primary Examiner*—William D. Larkins
*Attorney, Agent, or Firm*—Kurt Kelman

[57] ABSTRACT

The invention disclosed relates to a bulk semiconductor device having a semiconductor element exhibiting a negative conductivity under a high electric field and being capable of generating a high electric field domain therein. The semiconductor device includes two ohmic electrodes disposed at opposite ends to apply a bias voltage, at least one means for generating a high electric field domain in the semiconductor device by means applying an input signal to the generating means, at least one means for inhibiting generation of a high electric field domain by means applying another input signal to the inhibiting means, and means for detecting the existence of the high electric field domain in the semiconductor device to produce an output signal.

13 Claims, 65 Drawing Figures

Fig. 3
(A) 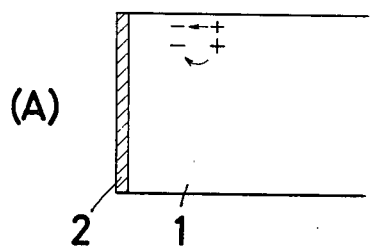
(B) 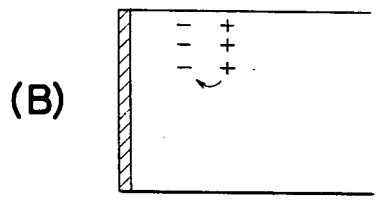
(C) 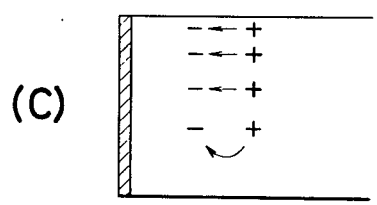
(D) 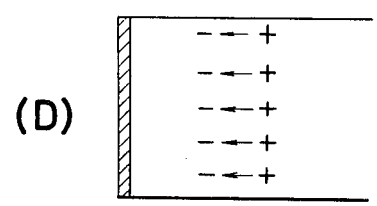
Fig. 4
(A) 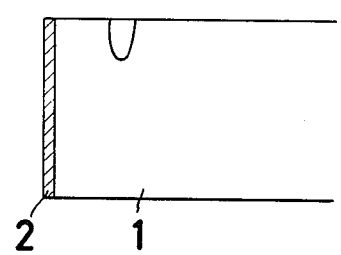
(B) 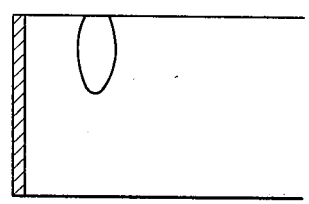
(C) 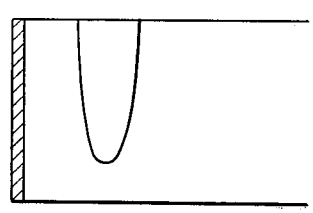
(D) 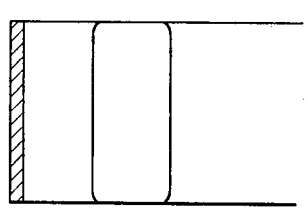

Fig. 7(A)
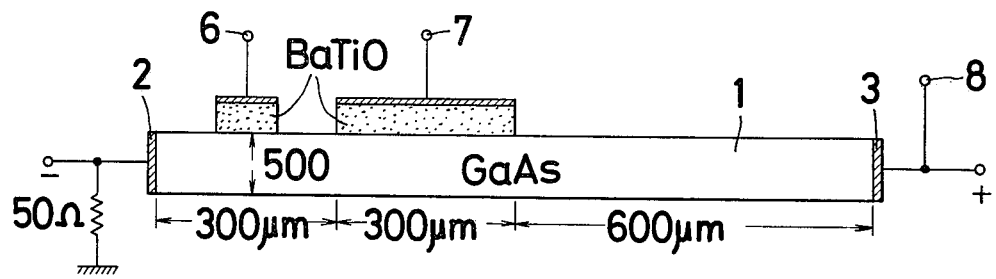
Fig. 7(B)
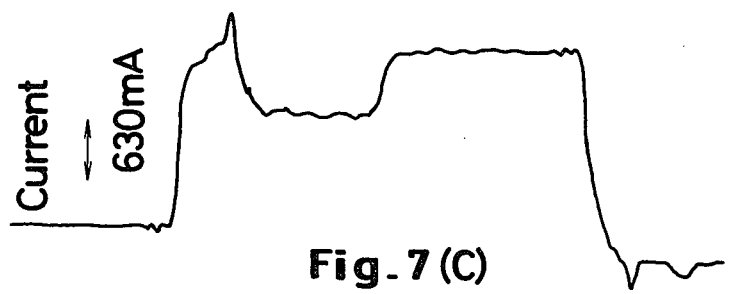
Fig. 7(C)
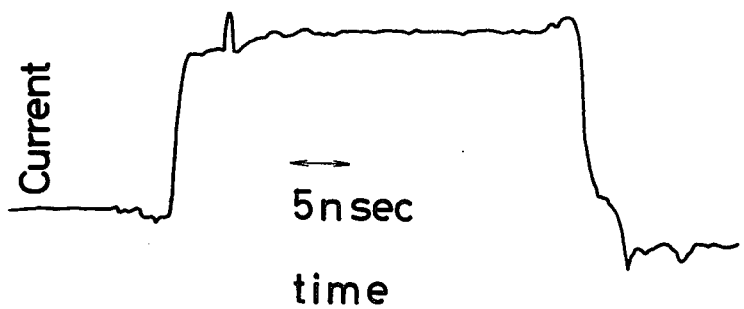
Fig. 8
| x | y | z |
|---|---|---|
| 0 | 0 | 0 |
| 1 | 0 | 1 |
| 0 | 1 | 0 |
| 1 | 1 | 0 |

Fig. 9
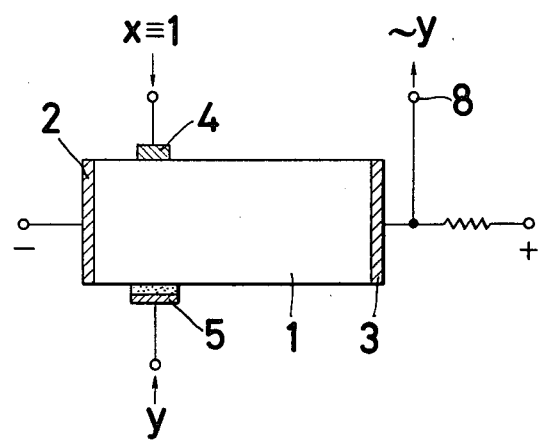
Fig. 11
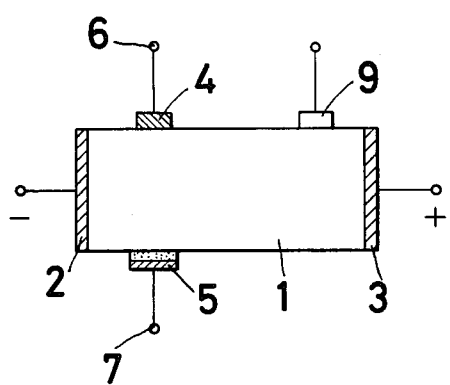
Fig. 12
Fig. 10
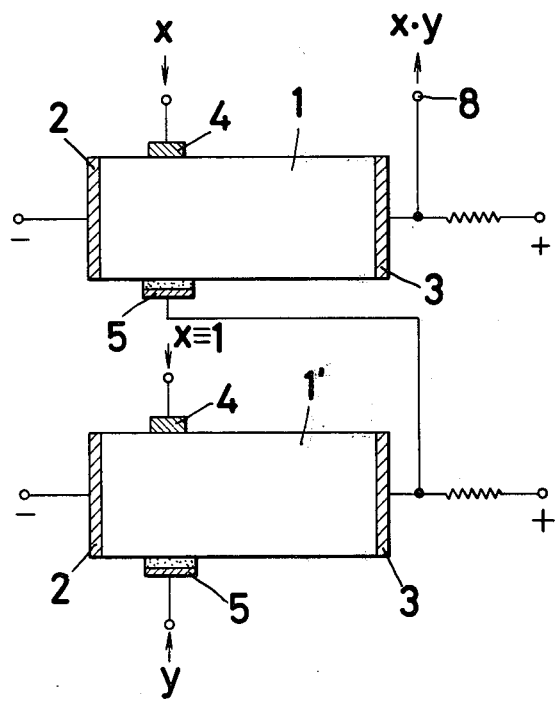
Fig. 13
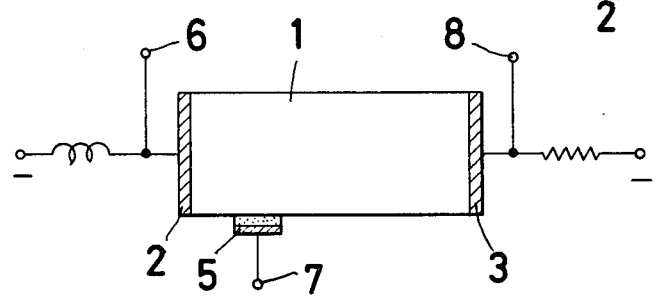

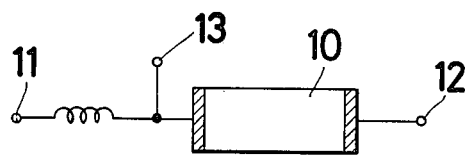
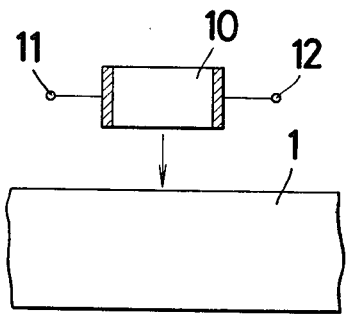
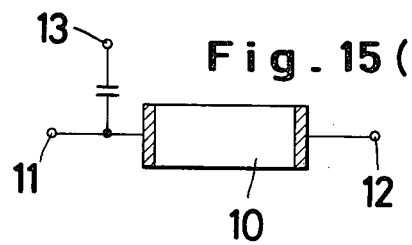
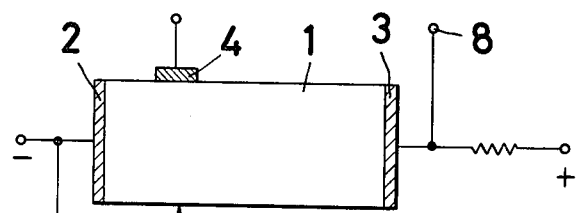
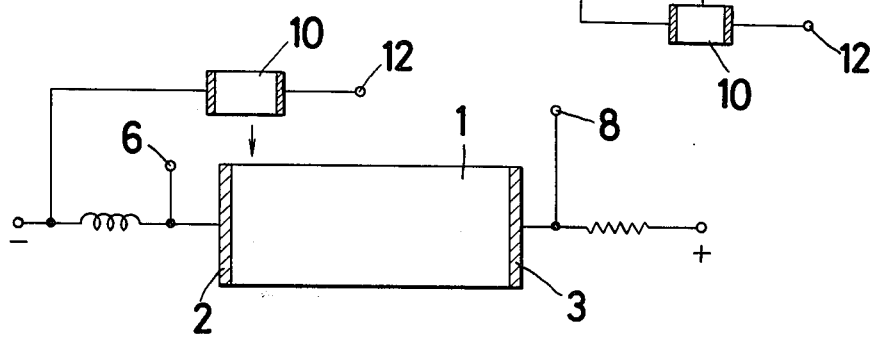
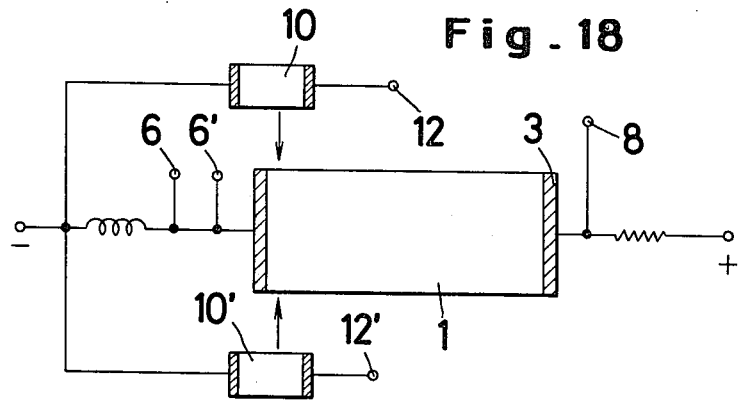

Fig. 21(A)
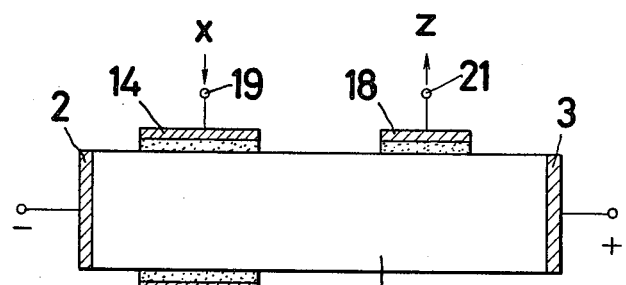
Fig. 21(C)
| x | y | z |
|---|---|---|
| 0 | 0 | 0 |
| 1 | 0 | 1 |
| 0 | 1 | 1 |
| 1 | 1 | 0 |
Fig. 21(B)
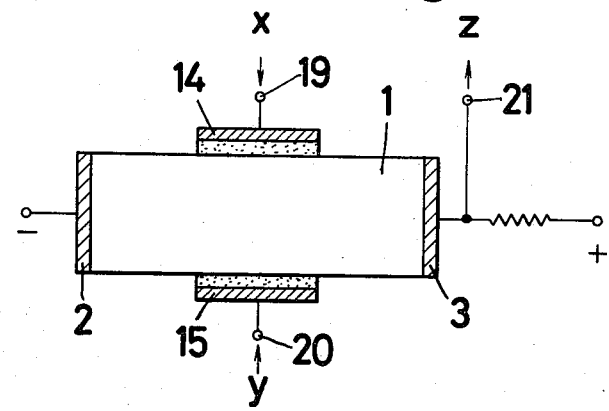
Fig. 22(A)
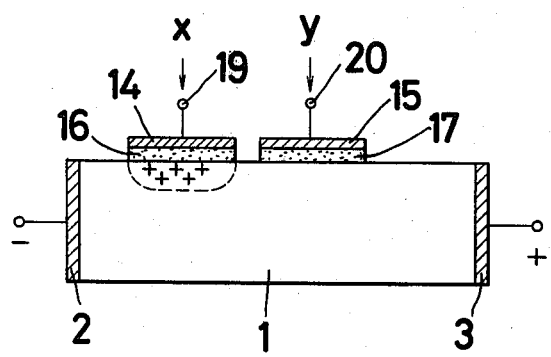
Fig. 22(B)
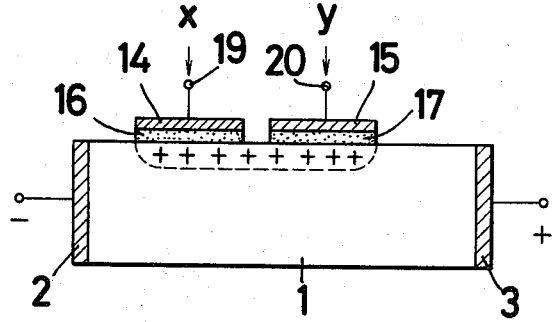

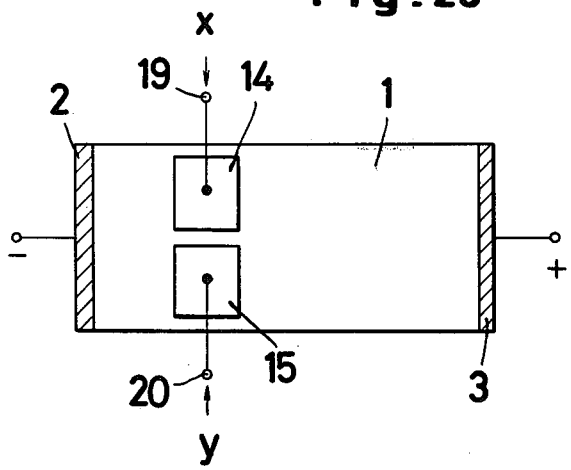
Fig. 23
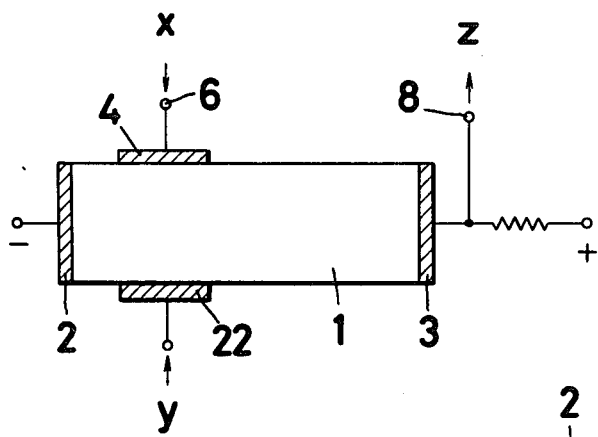
Fig. 25(A)
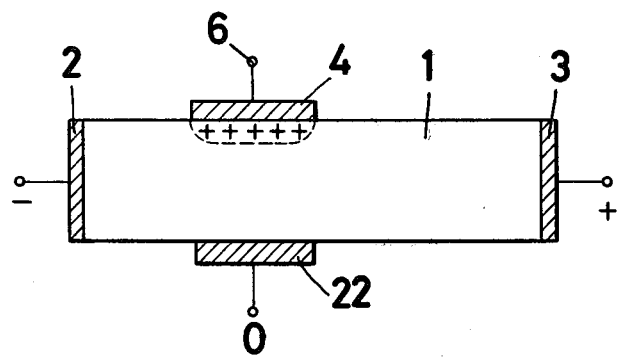
Fig. 24(A)
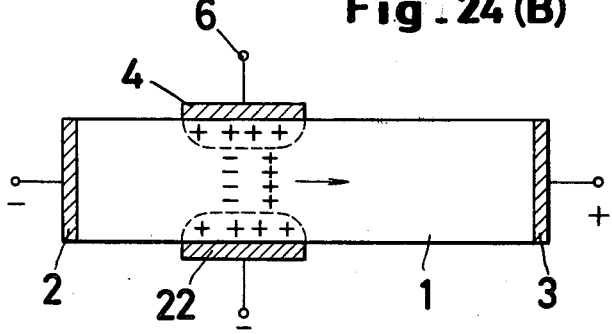
Fig. 24(B)
Fig 25(B)
| x | y | z |
|---|---|---|
| 0 | 0 | 0 |
| 1 | 0 | 0 |
| 0 | 1 | 0 |
| 1 | 1 | 1 |

Fig. 29
(A)
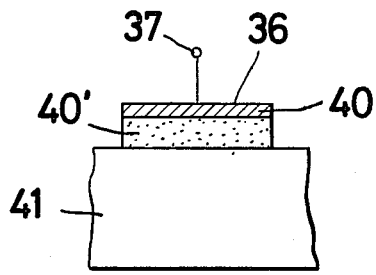
(B)
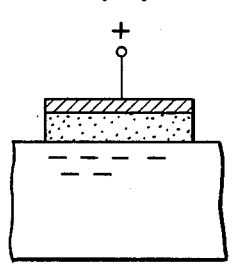
(C)
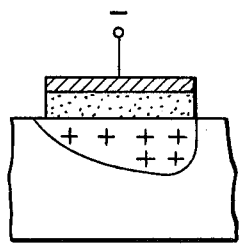
Fig. 28
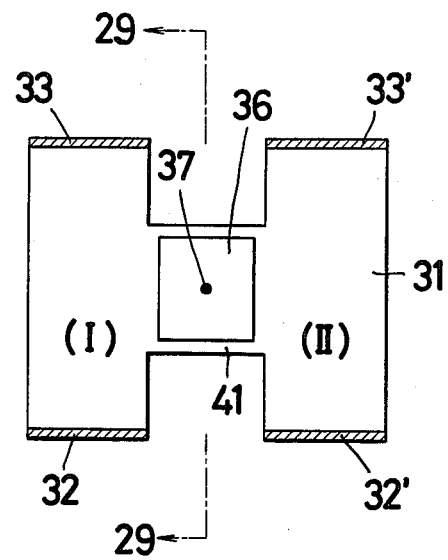

Current in Region (I)   Current in Region (II)

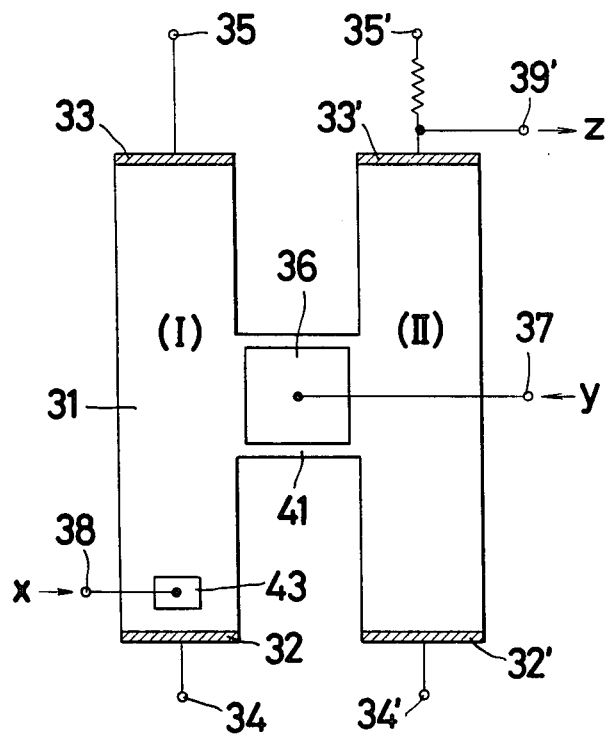
Fig. 32 (A)
Fig. 32 (B)
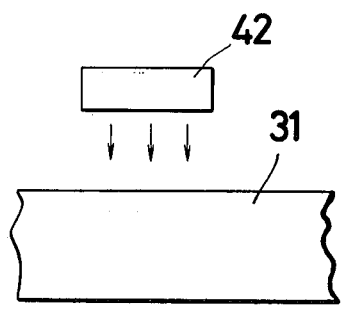
Fig. 31
Fig. 34 (B)
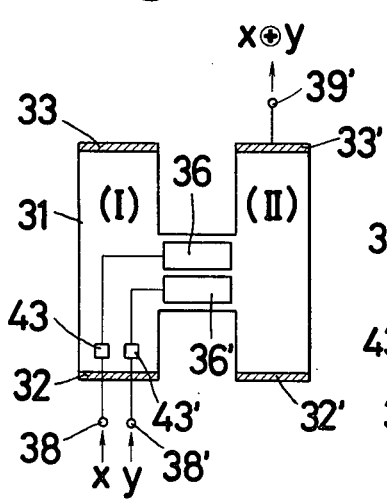
Fig. 34 (A)
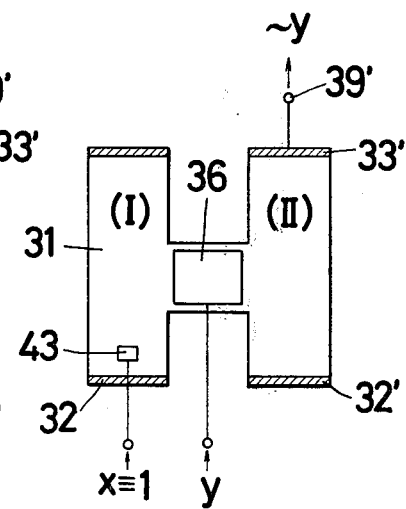
Fig. 33

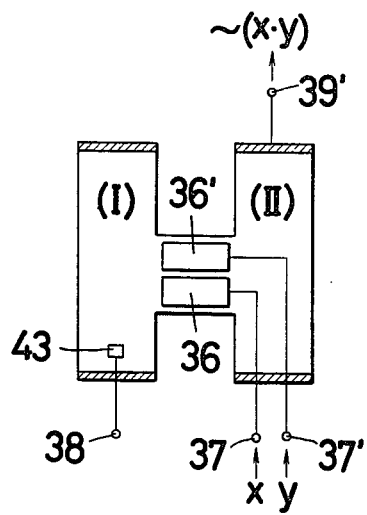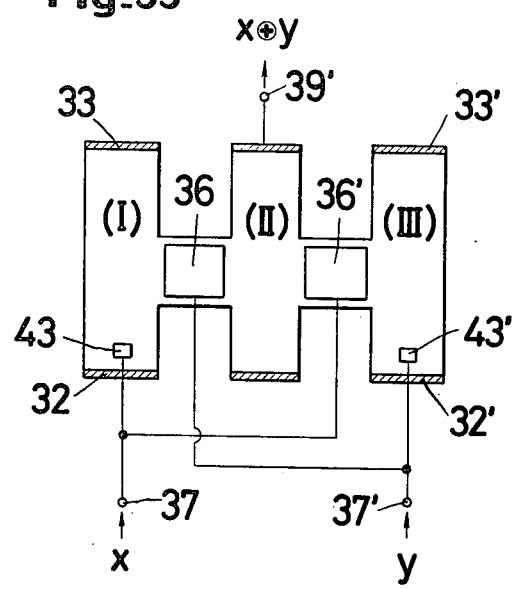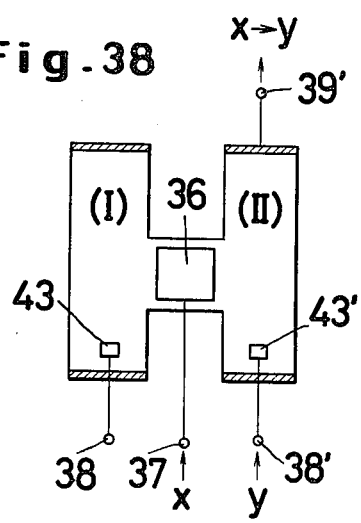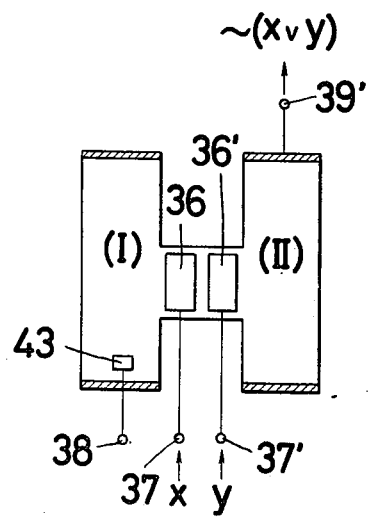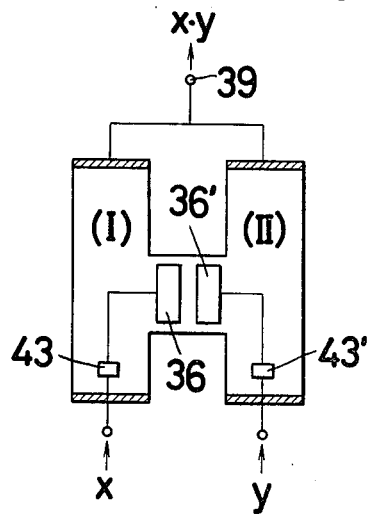

Fig. 41 (A)
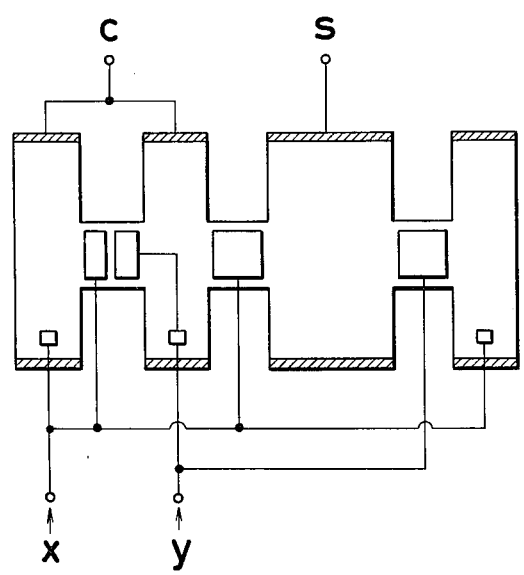
Fig. 40
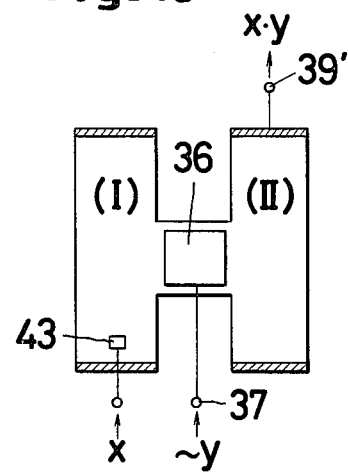
Fig. 41 (B)
| x | y | c | s |
|---|---|---|---|
| 0 | 0 | 0 | 0 |
| 0 | 1 | 0 | 1 |
| 1 | 0 | 0 | 1 |
| 1 | 1 | 1 | 0 |
Fig. 42
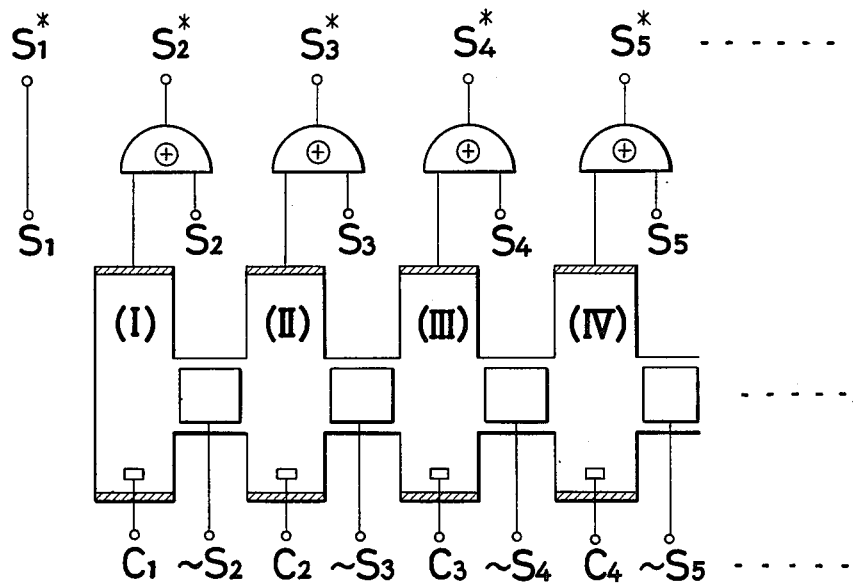

Fig. 43 (A)
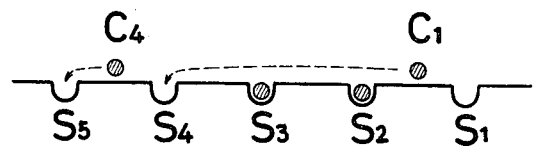
(B)
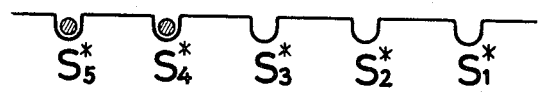
Fig. 44 (A)
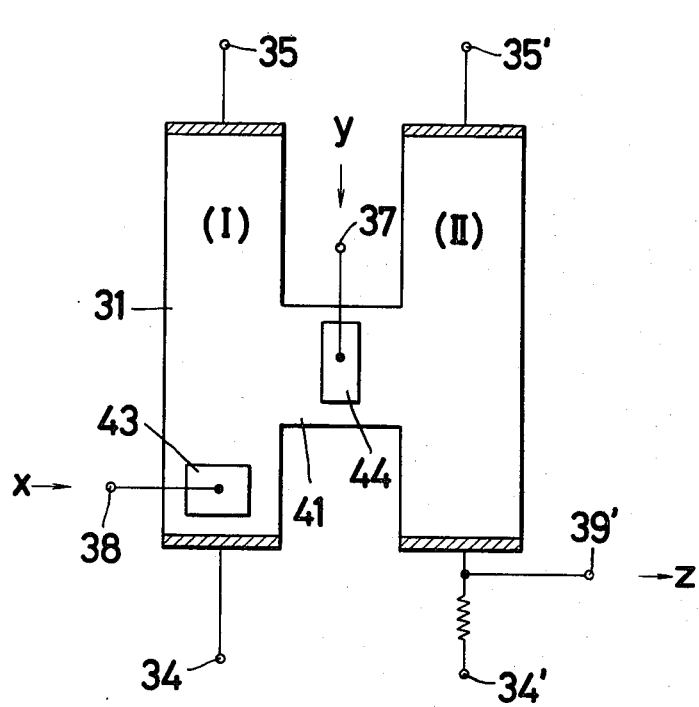
Fig. 44 (B)
| x | y | z |
|---|---|---|
| 0 | 0 | 0 |
| 1 | 0 | 0 |
| 0 | 1 | 0 |
| 1 | 1 | 1 |

SEMICONDUCTOR DEVICE

This is a division of application Ser. No. 417,300, filed Nov. 19, 1973, which is a continuation of application Ser. No. 165,636, filed July 23, 1971 both now abandoned.

The present invention relates to a bulk semiconductor device having means for controlling the growth of high electric field domain.

Recent electronic devices for use in information processing are required to have very high operation speed. However, in the conventional transistor using P-N junction structure, the operation speed is limited due to the capacitance inherent in such junction structure and the lifetime of injected carriers and the theoritical upper limit is considered as several GHz at most. With such value the time required to perform a logic operation is on the order of 1 nanosecond. In actual information processing, since a number of such semiconductor elements are connected in series to form a logic circuit, very long times are required to perform such logic operations as addition.

As for elements which can be operated at very high speed without limitation by a P-N junction, there is known the GaAs bulk semiconductor element which has negative conductivity at high electric field and provides an effect referred to as the Gunn effect wherein above a certain applied voltage a high electric field domain is generated in the vicinity of the cathode. This domain travels toward the anode to thereby provides a current oscillations. This semiconductor element itself is essentially a uniform N type semiconductor and the travelling velocity of the high electric field domain within a GaAs bulk semiconductor reaches $10^7$ cm/sec. Since the travelling speed of the domain is very high and thus the change in terminal current due to the generation and disappearance of such domains is very fast, such semiconductor is capable of responding to several hundred GHz and has therefore been utilized as an oscillation element for microwave or millimeter-wave and as a high speed logic element. The present inventors have previously invented a method for extinguishing a high electric field domain generated in such semiconductor element at any desired position before it reaches the mode thereof. Their earlier invention, made possible coupled with conventional methods for generating high electric field domains, several new kinds of very high speed logic operation circuits.

The primary object of the present invention is to provide a bulk semiconductor device having means for controlling a high electric field whereby a high electric field domain can be made to form or be prevented from forming at any given region of semiconductor element.

Other objects, features and advantages of the invention will be apparent from the following more detailed description of preferred embodiments of the invention, as illustrated in the accompanying drawings.

FIGS. 3 and 4 are illustration explaining the growing process of space charges and a high electrode field domain respectively in a semiconductor element;

Figure 5:
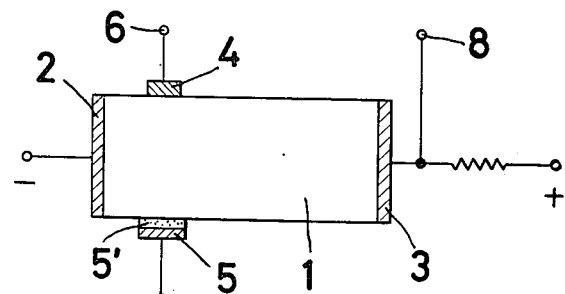
FIG. 5 is an illustration explaining the inhibiting of the generation of a high electric field domain in accordance with the present invention.
Figure 19:
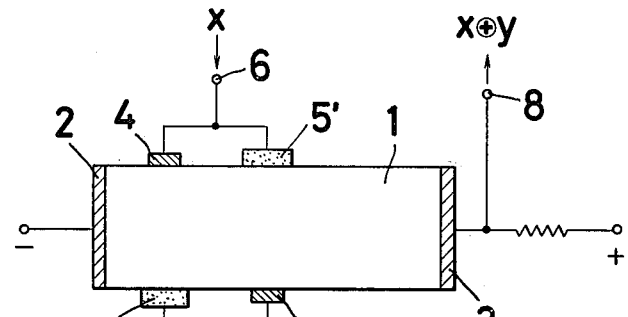
Figure 19:
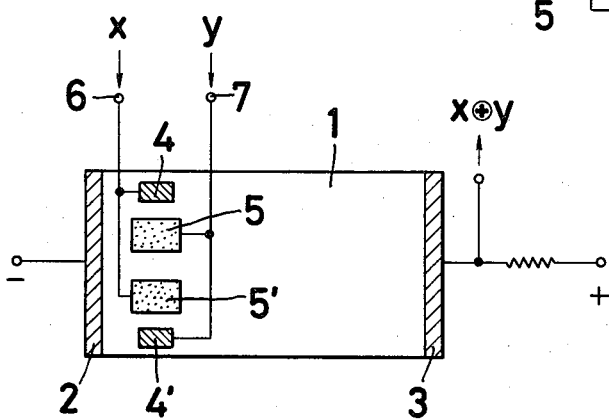
Figure 20:
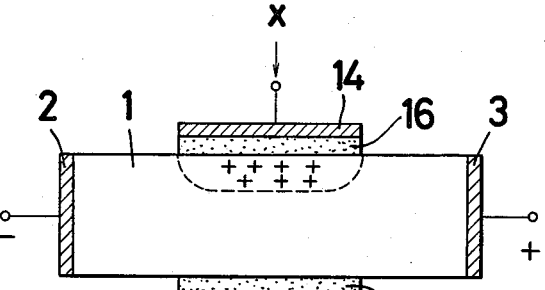
Figure 20:
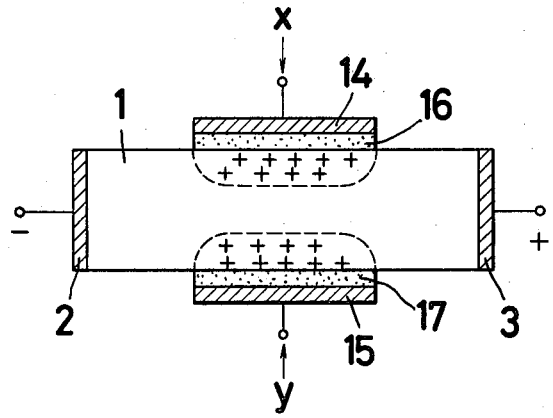
Figure 27:
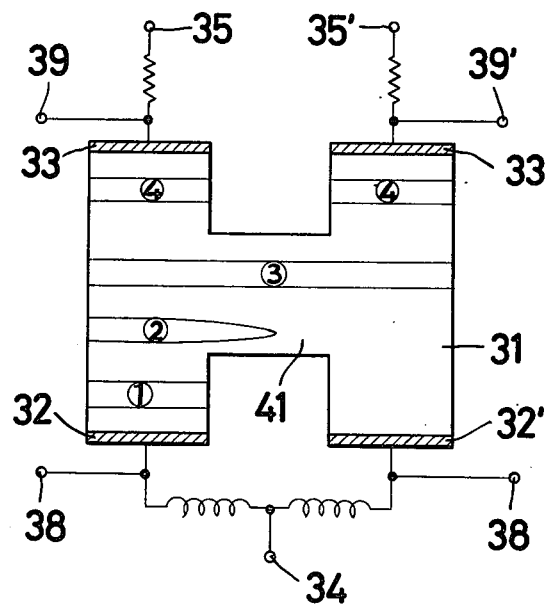
Figure 30:
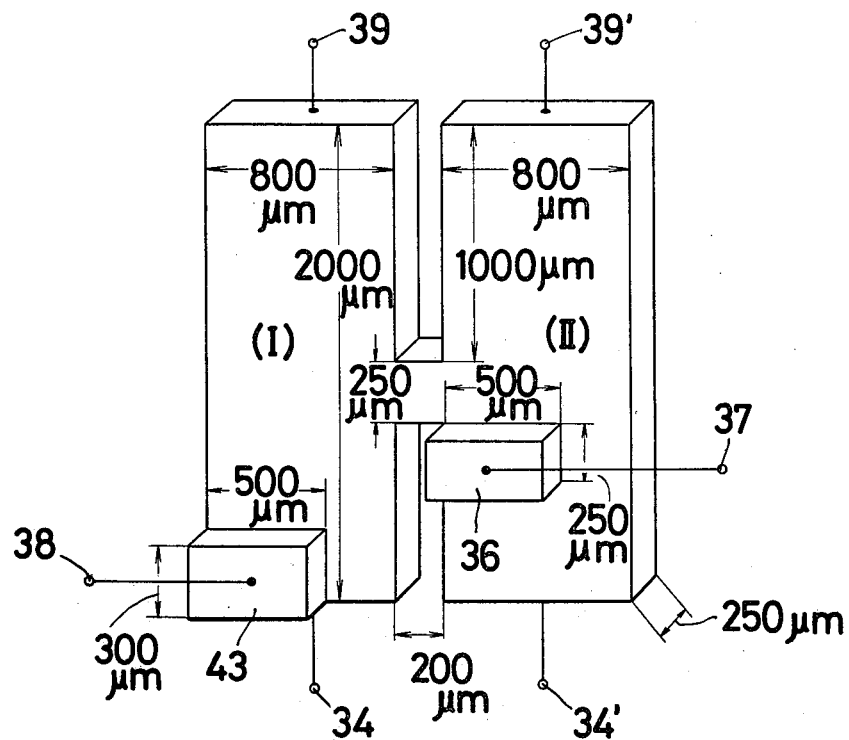
Figure 30:
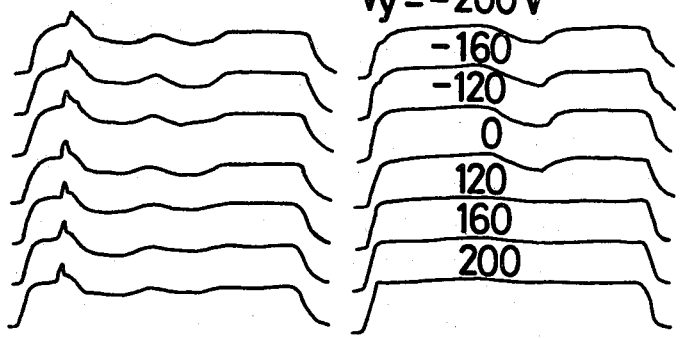
Figure 45:
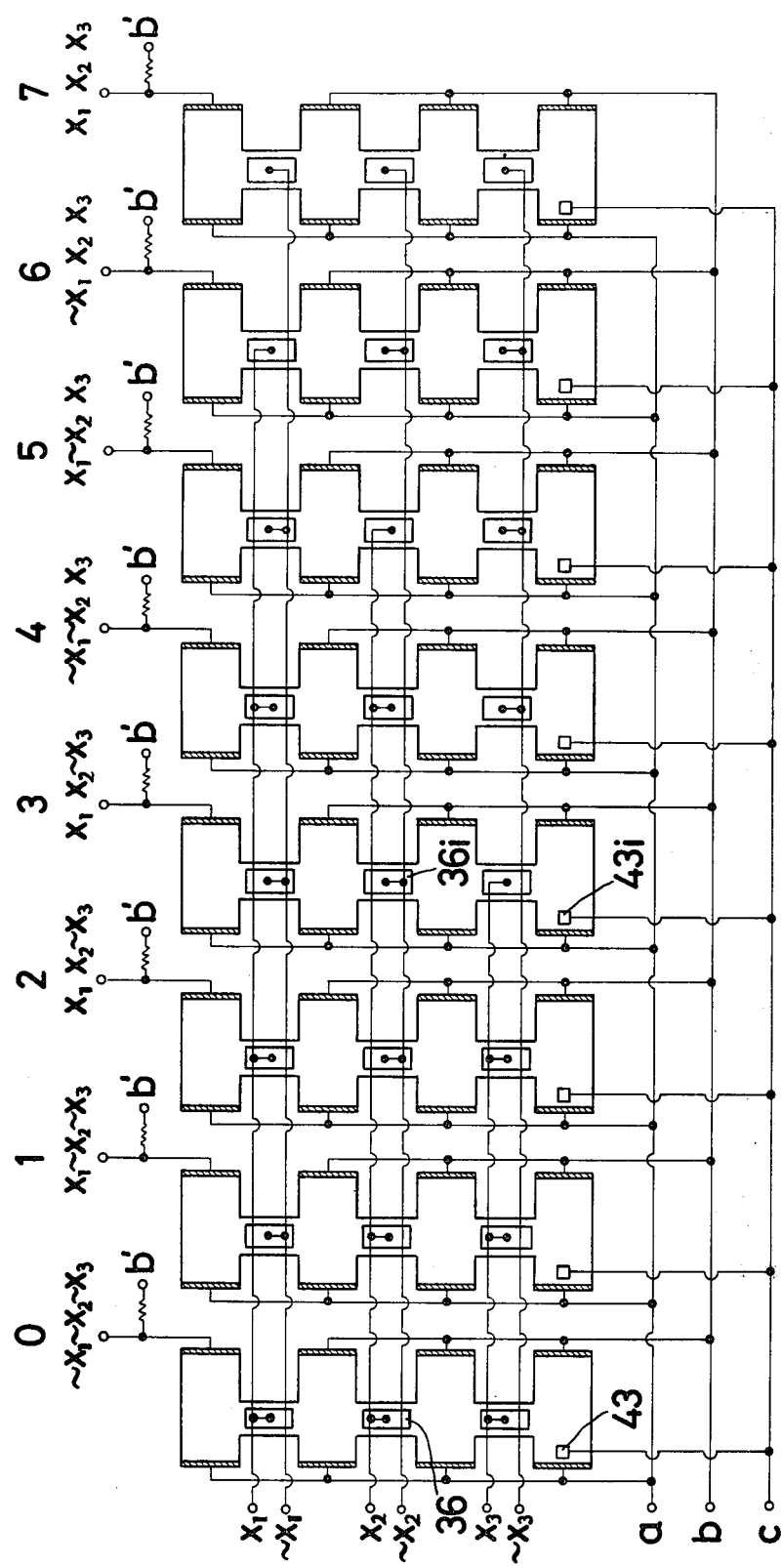
Figure 46:
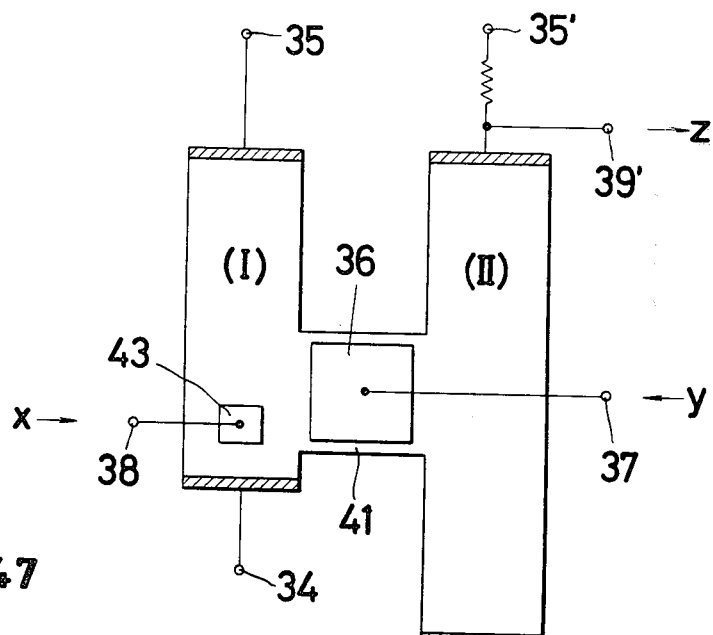
Figure 47:
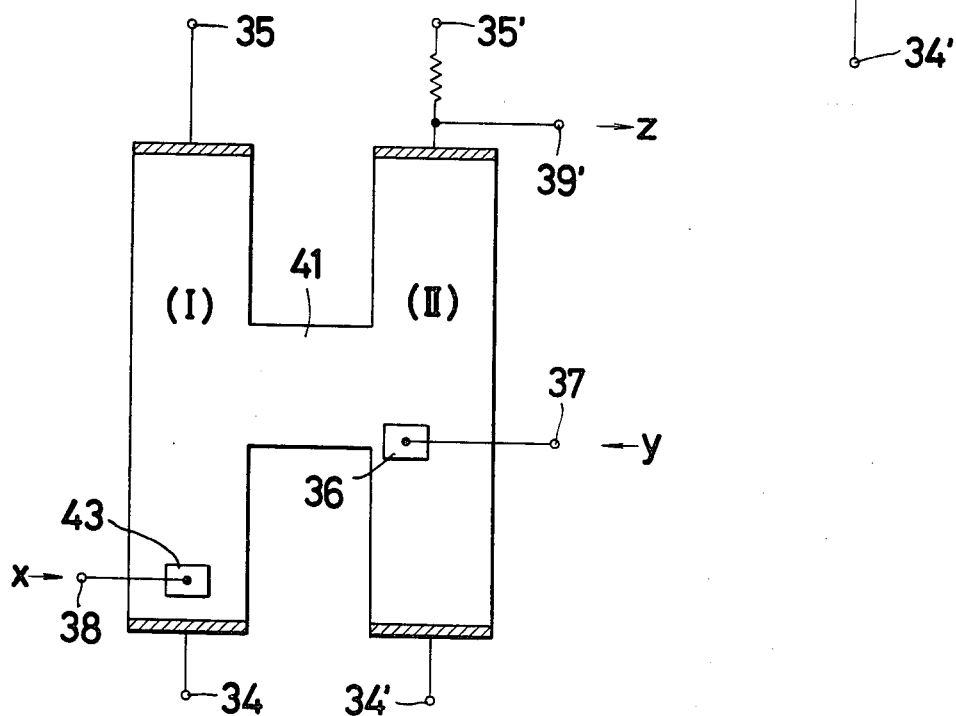

FIG. 7(A) explains an experimental bulk semiconductor device according to the present invention;

FIG. 7(B) and FIG. 7(C) show the experimental results obtained with the device in FIG. 7(A);

FIG. 8 is the truth table for the bulk semiconductor device in FIG. 5 used as an inhibitor;

FIG. 9 is an illustration explaining the present bulk semiconductor device when it is used in a negation circuit;

FIG. 10 is an illustration explaining the present device when it is used as a logic product circuit;

FIG. 11 is the truth table for the present device used as a comparator;

FIG. 12 shows one embodiment of the present device having a detection electrode;

FIG. 13 shows another embodiment of the present device shown in FIG. 12;

FIG. 14 shows another embodiment using an optical means for controlling the generation of a high electric field domain;

FIGS. 15(A) and (B) are embodiments of the optical control means in FIG. 14;

FIGS. 16 and 17 are embodiments, having the same functions as those of the devices in FIGS. 5 and 9 respectively, which use optical means for controlling the high electric field domain;

FIG. 18 is another embodiment having two optical control means;

FIG. 19(A) is an embodiment which is provided with two pairs of the present high electric field domain generating electrodes and the control electrodes;

FIG. 19(B) is another embodiment using two pairs of electrodes;

FIGS. 20(A) and (B) are embodiments which employ capacitive electrodes as the high electric field domain control electrodes;

FIGS. 21(A) and (B) are embodiments constructed by providing detection terminals on the device in FIG. 20 to perform logic operations;

FIG. 21(C) is the truth table of an EXCLUSIVE OR obtained with the devices in FIGS. 21(A) and (B);

FIGS. 22 and 23 show modifications of the device in FIG. 19;

FIGS. 24(A) and (B) show embodiments which use Schottky electrodes as the high electric field domain control electrodes;

FIG. 25(A) is an embodiment useful to perform a logic operation using the device in FIG. 24;

FIG. 25(B) is the truth table of an AND for the device in FIG. 25(A);

FIGS. 26(A) and (B) show embodiments which employ gate electrodes having resistive layers, as the high electric field domain controlling electrodes;

FIG. 27 is an illustration of the spatial growth mechanism of the high electric field domain when an H-shape semiconductor element is used;

FIG. 28 shows an H-shape semiconductor element provided with a control electrode;

FIGS. 29(A), (B) and (C) are crosssections taken along line 29—29 in FIG. 28;

FIG. 30(A) shows an experimental H-shape bulk semiconductor device;

FIG. 30(B) and FIG. 30(C) show the result obtained in the experiment using the device in FIG. 30(A);

FIG. 31 is a modification of the device in FIG. 28, in which an optical means is used as the control electrode;

FIG. 32(A) is an embodiment of the present invention employed to perform a logic operation;

FIG. 32(B) is the truth table of the logic operation of the device in FIG. 32(A);

FIG. 33 is an embodiment of the present invention when it is used as a negation circuit;

FIG. 34 is an embodiment of the present invention when it is used to perform as EXCLUSIVE OR operation;

FIG. 35 is an embodiment of the present invention which is constructed by combining two basic devices in FIG. 32 to provide three regions;

FIGS. 36 and 37 show modifications of the device in FIG. 33, in which the control electrode is divided into two laterally and longitudinally disposed electrodes respectively;

FIG. 38 is another embodiment of the present H-shape bulk semiconductor device;

FIGS. 39 and 40 show embodiments for producing an AND operation with the basic device in FIG. 32;

FIG. 41(A) shows a half-adder constructed in accordance with the present invention;

FIG. 41(B) is the truth table obtained by the device in FIG. 41(A);

FIGS. 42 and 43 are embodiments for high speed carry, each of which includes a plurality of regions;

FIG. 44 shows an embodiment having a Schottky electrode as the control electrode provided on the bridge portion between the regions;

FIG. 44(B) is the truth table of an AND obtained with the device in FIG. 44(A);

FIG. 45 is a decoder using the construction in FIG. 32 for the AND operation; and FIGS. 46 and 47 are modifications of the present H-shape semiconductor element in FIG. 32.

Figure 1:
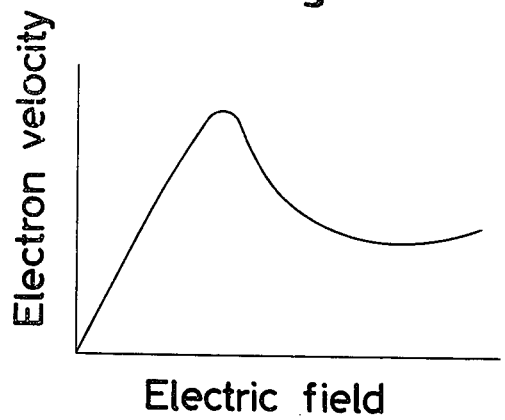
FIG. 1 is an illustration explaining the negative conductivity of a semiconductor element used in the present invention.
Figure 2:
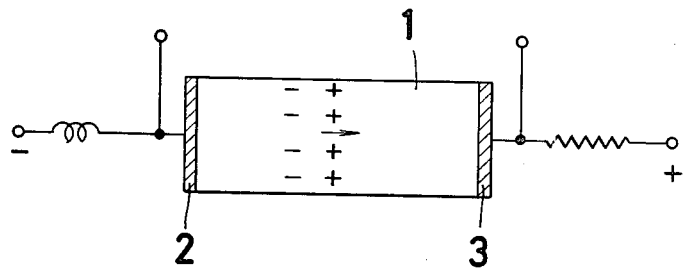
FIG. 2 shows a conventional bulk semiconductor element.

In a semiconductor such as GaAs and InP which has a negative conductivity at high electric field the average electron velocity is decreased at an electric field equal to or larger than its critical electric field as shown in FIG. 1. When a semiconductor 1 of this type is provided with ohmic electrodes 2 and 3 and a voltage above the critical value is applied therebetween as shown in FIG. 2, an accumulation of space charges builds up at a region where the internal electric field is at a relatively high level and thus a electric dipole layer is formed in the region, so that the electric field in the region becomes high enough to generate a high electric field domain. However, the accumlation of space charges and the resulting generation of a high electric field domain are not completed in the semiconductor instantaneously but the domain is generated through a process such as shown in FIGS. 3 and 4. However, the accumulation of space charges and resulting generation of a high electric field domain do not occur suddenly, but a process as shown in FIGS. 3 and 4 takes place. In an actual semiconductor, there always is fluctuation in carrier density or in geometry. Thus, there exists a local small part, where the electric field intensity is slightly higher than the other part of semiconductor. A nucleus of a high electric domain is produced in such a part, as shown in FIGS. 3(A) and 4(A) and developes gradually following to the sequences shown in FIGS. 3 and 4, which show space charge accumulations and electric high field respectively. As shown in FIG. 3(A), the leakage (shown by the bowed arrow) of the electric field generated by the initial space charge of such a nucleus acts to increase the electric field at the side thereof. As this phenomenon repeats itself, a uniform dipole layer is finaly generated in the semiconductor as shown in FIG. 3(D). Accordingly the process of the growth of high electric filed domain becomes as shown in FIG. 4(A) to 4(D). The growth of the high electric field domain spreads not only in lateral direction but also in the direction of thickness. The time required to generate the high electric field domain is determined by the relaxation time of the semiconductor which is ordinarily $10^{-11}$–$10^{-12}$ seconds. The speed of transverse spreading of the high electric field domain is in the range of $10^8$ – $10^9$ cm/sec., which is faster than the travelling velocity of the high electric field domain ($10^7$ cm/sec.) by one or two orders of manitude in the case of GaAs.

FIG. 5 illustrates the principle of the present device for inhibiting the generation of a high electric field domain, in which ohmic electrodes 2 and 3 for applying a bias electric field, an electrode 4 for generating a high electric field domain and another electrode 5 adjacent to the generating electrode 4 for inhibiting the generation of a high electric field domain are provided on a semiconductor element 1 having negative conductivity at a high electric field. A bias voltage slightly lower than the threshold voltage at which a high electric field domain can be generated within the semiconductor 1 is applied between the ohmic electrodes 2 and 3. Under this condition, when a signal is applied to only a terminal 6 connected to the generating electrode 4 and no signal is applied to a terminal 7 connected to the inhibiting electrode 5, a high electric field domain is generated in the semiconductor 1 upon the signal applied to the terminal 6 through the process shown in FIG. 4 and travels toward the anode electrode 3. Since the current flowing through the semiconductor 1 changes in response to this generation of the high electric field domain, an output voltage can be obtained from a terminal 8 connected to the anode 3 when, for example, a resistor is connected in a series with the semiconductor. However, if in this case both of the terminals 6 and 7 receive signals at the same time, the electric field interior of the semiconductor 1 is lowered preventing such high electric field domain from being generated, so that no high electric field domain is generated and thus no output appears at the terminal 8.

The electrode 4 for generating a high electric field domain may be of ohmic or non-ohmic, or of any suitable type so long as it can produce a local high electric field upon application of the external signal. The high electric field domain may also be generated by applying a pulse voltage to the cathode 2 directly. As an example, FIG. 13 illustrates an embodiment using the cathode electrode 2 as an electrode for generating a high electric field domain.

Figure 6:
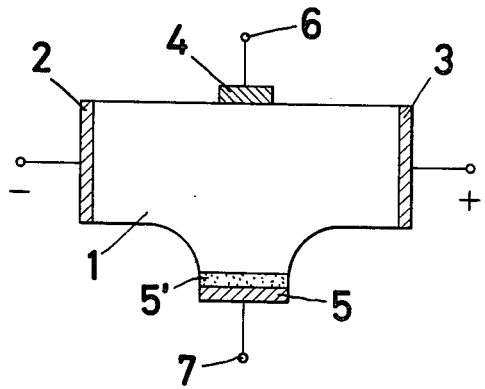
FIG. 6(A) shows one embodiment of the bulk semiconductor device according to the present invention.
FIG. 6(B) shows another embodiment of the bulk semiconductor device according to the present invention.
Figure 6:
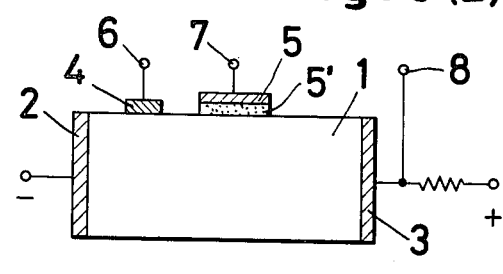

The electrode 5 for inhibiting the generation of a high electric field domain may also be of any type so long as it acts to lower the electric field within the semiconductor 1 in response to an external signal. One method of lowering the electric field is to widen the crosssection of the active region in the semiconductor by an external signal. An example is shown in FIG. 6(A) in which the capacitive electrode 5 is disposed on the opposite side of semiconductor 1 to the generating electrode 4 through an insulating material 5'. The crosssection of this part of semiconductor is made wider than the other part.

When a negative bias voltage is applied to the capacitive electrode 5, the depth of the depletion due to the field effect is big enough to make the active width of the semiconductor the same as the other part of the element. However, if a positive signal pulse is superimposed on the bias voltage, the depth of depletion is reduced leading to widening of the active width of the semiconductor and the electric field there is lowered. As to the position at which the inhibiting electrode 5 is to be provided, it need not necessarily be positioned oppositely through the semiconductor 1 to the generating electrode 4 so long as it can inhibit the generation of a high electric field domain at the lateral and/or longitudinal positions with respect to the electrode 4.

An example is shown in FIG. 6(B) in which a capacitive electrode 5 is disposed on an insulating material 5' provided longitudinally with respect to the high electric field domain generating electrode 4 on the semiconductor 1. When a negative voltage is applied to the capacitive electrode 5, the depth of the depletion layer is enough to make the active width of the semiconductor under the capacitive electrode 5 relatively thin, raising the local electric field there and thus lowering the electric field at that part of the semiconductor 1 which is under the generating electrode 4 whereby inhibiting a high electric field domain from generating even when a signal is applied to the generating electrode 4. FIG. 7(A) shows an example of an actual embodiment of a device based on the above mentioned principle. In FIG. 7(A) a GaAs element 1 made from material of doping $4 \times 10^{14} cm^{-3}$ and 1200 μm in length, 50 μm in thickness and several hundreds μm in width is ohmic contacted on both ends to provide biasing electrodes 2, 3. On one of the broad surfaces of the semiconductor to separate BaTiO$_3$-metal structures are placed to form a high electric field domain generating electrode 4 and a high electric field domain inhibiting electrode 5 respectively. A D.C. bias voltages of 350 V, which is just below the threshold voltage was applied between the electrodes 2 and 3. When a positive spike signal of about 50 V was applied to the generating electrode 4, a high electric field domain was generated under the electrode 4, traveled down the semiconductor 1, reached and was absorbed into the anode 3. This process is evidently seen in the current trace through the semiconductor shown in FIG. 7(B). However, when a negative voltage of 350 V was applied to the inhibiting electrode 5 simultaneously with the signal to the generating electrode 4, a high electric field domain was inhibited from being formed as was evedent from the current trace through semiconductor shown in FIG. 7(C).

Where $x$ represents a input signal to be applied to the generating electrode 4 and $y$ represents another input signal to be applied to the inhibiting electrode 5, the truth table representing the relationship between the output signal $z$ obtainable at the terminal 8 and the input signals $x$ and $y$ is as shown in FIG. 8 and a logic operation $z = x. \sim y$ can be performed. Since this is a modification of Scheffer's stroke or an inhibitor, and any desired operation circuit can be constructed by combining this operation.

Thus, in the present invention, an electrode for generating a high electric field domain and an electrode for inhibiting the generation of a high electric field domain are provided to select either of two conditions to generate or to inhibit the generation of a high electric field domain so that a logic operation is performed between two signals. By this means, very high speed operation is achieved because such operation does not require the substantial delays which are inherent in the steps of extinguishing the established high electric field domain and of travelling thereof. Only time required for this operation is the time of domain generation, which is the order of $10^{-11} - 10^{-12}$ as described.

FIG. 9 shows an embodiment of a negation circuit. If a steady signal is kept applied to the generating electrode 4 in FIG. 9, an output voltage appears only when no signal is applied to the inhibiting electrode 5. Thus negation $\sim y$ is obtained at the output terminal 8. FIG. 10 shows an embodiment of a logic product circuit, where such negation device shown in FIG. 9 is connected in series with the inhibitor device shown in FIG. 5. As $\sim y$ obtained from the output terminal of the negation device 1' is fed to the inhibitor electrode 5 of the inhibitor device 1, logic product of $x.y$ is finally obtained from the output terminal 8 of the inhibitor 1.

When a signal representing $x \vee y$ and a signal representing $x.y$ are applied to the generating and inhibiting electrodes of the device shown in FIG. 5 respectively, the truth table becomes as shown in FIG. 11. Therefore an output representing EXCLUSIVE OR, $x \oplus y$, is obtained at the output terminal 8 and this becomes a comparator.

In the device of the past invention, an output can be obtained as a change in the current flowing through the element, which is detected by connecting a resistor in series therewith as shown in FIG. 5. The reason for this is that when a high electrical field domain is generated in a bulk semiconductor element, the current in the element is decreased simultaneously. Accordingly an output signal appears at substantially the same instant as that of the generation of the high electric field domain and thus the operation speed is much faster than in a device where the travel of a high electric field domain is used. Alternative way to detect whether the high electric field domain is generated or not is to provide an additional electrode 9 on the semiconductor 1 for such detection as shown in FIG. 12.

It should be noted that in the present invention the signals $x$ and $y$ to be applied to the generating electrode 4 and inhibiting electrode 5 respectively are not always required to be synchronized with each other provided that the time duration of the signal $y$ is equal to or larger than the time duration of the signal $x$.

Furthermore, irradiating the semiconductor element 1 with a light can be used as an inhibiting means in the present invention. Light energy increases the carrier density in the irradiated part, the electric field can be lowered locally. For example a light emitting element 10 such as light emitting diode is used for this purpose as shown in FIG. 14. FIG. 15 shows a method for imposing a signal current on a constant bias current flowing between the terminals 11 and 12 of a light emitting element 10 in FIG. 14. FIG. 15(A) shows a circuit where the signal current being directly applied to the light emitting element 10 and blocked by an inductance to the bias circuit and FIG. 15(B) shows a circuit where the bias current is blocked to the signal circuit by a capacitor. In any case it is intended to effectively obtain a change in light in response to the signal current applied from the terminal 13 on a bias current flowing between the terminals 11 and 12.

FIG. 16 shows an embodiment employing a light emitting element 10 and operable in a similar manner to the construction shown in FIG. 5, and FIG. 17 is an embodiment operable in a similar manner to the construction in FIG. 13. FIG. 18 is another embodiment in which by applying signals $x$ and $y$ to the terminals 6 and 12, and the terminals 6' and 12' respectively a signal representative of $x \oplus y$ is obtainable at the output terminal 8, this embodiment employing two photo-emissive elements 10 and 10'.

FIGS. 19(A) and (B) show embodiment provided with two or more pairs of the high electric field domain generating electrode 4 and 4' and the inhibiting electrodes 5 and 5'. FIGS. 19(A) and 19(B) in which generating electrodes 4 and 4' and corresponding inhibiting electrodes 5 and 5' are provided longitudinally and transversely, respectively, the electrodes 4 and 5 operating as one pair and electrodes 4' and 5' as the other pair. It should be noted that the inhibiting electrode 5 has a function to inhibit a high electric field domain formation only for the generating electrode 4, and the inhibiting electrode 5' only for the generating electrode 4'. Therefore, when the electrodes 4 and 5' and electrodes 4' and 5 are connected with each other respectively and referred to as terminals 6 and 7 respectively and signals $x$ and $y$ are applied to the terminals 6 and 7 respectively, the output appearing on the output terminal 8 becomes $x \oplus y$ as shown in the truth table in FIG. 11 resulting directly in an EXCLUSIVE OR operation of the signals $x$ and $y$.

While embodiments using a semiconductor exhibiting a negative conductivity under a high electric field on which is provided electrodes for applying a biasing electric field for generating a high electric field domain and for inhibiting the generation of such domain have been described, another example in which the high electric field domain can be controlled by providing two control electrodes on the semiconductor instead of the electrodes for generating and inhibiting the high electric field domain.

FIG. 20 shows the basic construction of an element suitable to be used in the latter embodiment. Referring to the drawing, control electrodes 14 and 15 are provided on the opposite surfaces between ohmic electrodes 2 and 3 provided on the semiconductor element 1. The control electrodes 14 and 15 may take any suitable structure exhibiting the field effect, such as MOS structure or Schottky barrier etc. FIG. 20 shows an embodiment employing a MOS structure in which the control electrodes 14 and 15 which exhibit the field effect are provided on the semiconductor 1 through insulators 16 and 17.

Across the ohmic electrodes 2 and 3 of the semiconductor is applied a voltage which is higher than a high electric field domain sustaining voltage and lower than the high electric field domain generating voltage. Under this condition, no high electric field domain can exist within the semiconductor 1. If a negative signal voltage is applied to either of the control electrodes 14 and 15 an electron depletion layer is produced in the semiconductor portion beneath the selected control electrode 14 or 15 due to the field effect as shown by the dotted line in FIG. 20(A). Since this can be considered as equivalent to a decrease in the crosssection of the semiconductor portion, the electric field strength at this portion is increased. Consequently, when the potential at either of the control electrodes is negative, the electric field strength at the portion of the semiconductor beneath the control electrode becomes high enough to generate a high electric field domain and the resulting domain travels through the semiconductor toward the anode. On the other hand, when negative signal voltages are applied to both of the control electrodes 14 and 15, the effective thickness of the semiconductor is further decreased as shown in FIG. 20(B), so that no high electric field domain travelling along the semiconductor is generated. This phenomenon may be considered to occur through either or both of two different mechanisms. One of the mechanisms is that the high electric field domain may not be generated because the effective thickness of the semiconductor portion under the control electrodes decreases, and thus the rate of leakage of electric field due to space charges out into the electron depletion layer and also out to surroundings of semiconductor increases so much that generation of a high electric field domain is inhibited.

The other mechanism is that the travelling high electric field domain cannot exist because the major portion of the bias voltage applied to the semiconductor is consumed in the portion under the control electrodes because the effective thickness of that portion is decreased and the electrical resistance of which is thus increased, and the electric field strength at the remaining semiconductor portion is lowered to a value less than the domain sustaining voltage. Although it may be considered that such phenomenon is introduced by some complicated combination of these two mechanisms, it should be noted in any case that when negative signal voltages are applied to both of the control electrodes at the same time no high electric field domain is generated.

Accordingly as shown in FIG. 21(A), when the digital signal voltages $x$ and $y$ are applied to the terminals 19 and 20 connected from to the control electrodes 14 and 15 respectively and the output $z$ representative of whether a high electric field domain exists or not is derived from the terminal 21 connected to the output electrode 18 via a capacitive coupling through the insulator disposed between the electrode 18 and another portion of the semiconductor surface, the truth table of the inputs $x$ and $y$ and the output $z$ becomes that shown in FIG. 21(C) and thus the EXCLUSIVE OR operation of the inputs $x$ and $y$ are obtained as the output $z$. FIG. 21(B) shows another embodiment having a series resistor instead of the capacitive electrode in which the high electric field domain is detected as change in current flowing through the semiconductor and the output $z$ is obtained from the terminal 21 connected to the electrode 3. This embodiment provides an EXCLUSIVE OR of the inputs $x$ and $y$ as the output $z$ as shown in FIG. 21(C).

FIG. 22 shows another embodiment of the present invention in which two control electrodes 14 and 15 are provided on a common surface of the semiconductor 1 along its length. When a signal is applied to either of terminals 19 and 20 connected to the control electrodes 14 and 15 respectively, an electron depletion layer is produced under the selected electrode 14 or 15 and the electric field intensity at that portion is increased as shown in FIG. 22(A), so that a high electric field is generated thereat. On the contrary, if both of the terminals 19 and 20 receive signal voltages simultaneously, the electron depletion layers are extended to beneath both control electrodes as shown in FIG. 22(B). According the length of the apparent depletion layer becomes larger, the potential drop across the portion is increased and the field intensity at the remaining portion of the semiconductor is reduced to a value less than the high electric field domain sustaining field, and thus there cannot be generated a high electric field domain which travells along the length of the semiconductor. Therefore, when the presence or absence of high electric field domain is detected, in a manner similar to that of the embodiment shown in FIG. 21, as the output z, an EXCLUSIVE OR of the input signals x and y to be applied to the terminals 19 and 20 connected to the control electrodes 14 and 15 respectively can be obtained.

FIG. 23 shows another embodiment of the present invention having two control electrodes 14 and 15 on a common surface of the semiconductor 1 in such a manner that the electrodes are positioned along a direction normal to the lengthwise direction of the element, in which when a signal applied to only one of the two terminals 19 and 20 connected to the control electrodes the internal field intensity of the semiconductor is locally increased, while when signals are applied to both of the terminals 19 and 20 simultaneously no high electric field domain movable along the semiconductor can be generated because the electron depletion layer is produced, so that the potential drop across this portion of the semiconductor is increased and the field intensity in the remaining portion is lowered below the high electric field domain sustaining voltage. Accordingly, if the presence or absence of the high electric field domain is represented by output z, an EXCLUSIVE OR of the two digital signals x and y applied to the terminals 19 and 20 is obtainable.

Where a Schottky electrode 22 is employed as the electrode for inhibiting the generation of a high electric field domain and when no voltage is applied to the Schottky electrode 22, no high electric field domain is granted because the electric field in the semiconductor is substantially short circuited by the Schottky electrode 22 even when a signal is applied to the generating electrode 4 for generating the high electric field domain as shown in FIG. 24(A). However, where a negative voltage signal is applied to the Schottky electrode 22 at the time of the signal application to the electrode 4, the short-circuit effect due to the metal disappears and thus a high electric field domain is generated as shown in FIG. 24(B).

Accordingly, where the input signals are represented by x and y and an output z is derived from the output terminal 8 as change in current flowing through the element 1 as shown in FIG. 25(A), the truth table as shown in FIG. 25(B) is obtained resulting in AND operation.

This function of the Schottky electrode may be obtained by using a resistive layer inserted between the semiconductor surface and the metal electrode. That is, when no voltage or a positive voltage is applied to the inhibiting electrodes shown in FIG. 26(A), which is constituted with a resistive layer 24 inserted between the semiconductor 1 and the metal 23, the electric field in the semiconductor under the inhibiting electrode 23 is decreased, so that no high electric field domain is generated even when a signal is applied to the domain generating electrode 4. On the contrary, when a negative voltage is applied to the inhibiting electrode 23, an electron depletion layer is produced at the interface between the semiconductor 1 and the resistive layer 24, so that the resistive layer 24 does not affect the electric field in the semiconductor and thus a high electric field domain is generated as shown in FIG. 26(B).

The same function of the previously described capacitive high electric field domain inhibiting electrode may be obtained with a Schottky electrode or resistive electrode provided that a predetermined negative bias voltage is applied thereto and then a positive pulse signal is also applied to the same electrode.

A further embodiment of the present invention will now be described with reference to the principle illustrated in FIGS. 27 and 28, which is a method for inhibiting and/or permitting a high electric field domain to generate in a specific region of a semiconductor by using the spatial growth of the high electric field domain in the lateral direction.

FIG. 27 shows an embodiment in which an H-shaped semiconductor element 31 exhibiting a negative conductivity is provided at the respective ends thereof with ohmic electrodes 32, 32', 33 and 33'. In this embodiment a DC bias voltage is applied to the terminals 38, 35 and 35', trigger signal voltage is appled to the terminal 34, and a high electric field domain ① is generated in the vicinity of the left side cathode 32 of the element 31 and travels toward the anode 33. When the domain ① reaches the bridge portion 41 of the element, it begins to grow in the lateral direction and spreads from ② to ③. The domain ③ is further divided into left and right domain ④ and the domain ④ which reach the anodes 33 and 33' respectively. The present invention is intended to perform a logic operation by controlling of the lateral growth of the domain, with a capacitive electrode or other means provided at a position of the element where the high electric field domain begins to grow in the lateral direction, as shown in FIG. 28.

FIG. 29 illustrates the function of the capacitive electrode for use in achieving the purpose. When no signal voltage is applied to a terminal 37 connected to an electrode 36 constituted with a metal 40 and an insulator 40' sandwiched between the metal 40 and a surface of the semiconductor 31 exhibiting negative conductivity, there is no considerable change in distribution of charge in the semiconductor as shown in FIG. 29(A). On the contrary when a positive signal voltage is applied to the terminal 37 the electrons in the semiconductor are attracted to the electrode and an accumulation of electrons occurs as shown in FIG. 29(B). Consequently the field intensity in the region under the capacitive electrode is weakened and thus the spreading of a high electric field domain in lateral direction is inhibited.

On the other hand when a negative voltage is applied to the terminal 37 an electron depletion layer is produced beneath the electrode as shown in FIG. 29(C) and the effective crosssectional area of the semiconductor is decreased. Accordingly, the electric field intensity at that portion is raised to promote the spatial growth of the high electric field domain. Thus the spatial growth of the high field domain can be controlled by the voltage applied to the terminal 37.

An example of the performance of a H-shape semiconductor element 31 such as shown in FIG. 30(A) is shown in FIGS. 30(B) and (C).

The H-shaped device was made from n type GaAs with a carrier concentration of $3 \times 10^{13}$ cm$^{-3}$ and an electron mobility of 8000 cm$^2$/Vs. The device has four ohmic electrodes prepared by evaporation and alloying of Au-Ge at each end. Two capacitive electrodes were prepared on the surface of the GaAs by attaching silver-evaporated BaTiO$_3$ sheets with epoxy resin; one as a generating electrode 43 near the cathode in the left hand region ($\tau$), and the other as a control electrode 36 near the bridge portion 41 in the righthand region (II).

The generating electrode 43 is to generate a high electric field domain in region (I) and the control electrode is to control the lateral spreading of the domain into region (II).

Bias-voltage pulses of 580 V and 35 ns duration were simultaneously applied to the anodes of both regions. A signal-voltage pulse of 100 V as signal x was applied 5 ns after the application of the bias pulse for both the presence and absence of the control-voltage pulse, of 102 V which was, for convenience, chosen to be of nearly the same duration as the bias voltage pulse. The bias-voltage pulse amplitude was adjusted between the sustaining and the threshold voltages, so that the device always operated in the triggered mode.

If the potential of the control electrode 36 is fixed to zero (the same potential as the cathode) during the bias-voltage pulse application, a depletion layer is formed in the GaAs under the control electrode 36 located near the bridge portion 41. This depletion layer raises the electric field in GaAs near the bridge portion 41 and thus lets the generated high electric filed domain in region (I) spread laterally into region (II) as the domain reaches the bridge portion 41. If the potential of the control electrode 36 is fixed to a certain positive value, on the other hand, the depletion layer under the control electrode 36 decreases in size to reduce the electric field in the GaAs near the bridge portion 41 so that the triggered domain in region (I) may not spread into region (II).

Current waveforms in regions (I) and (II) observed through 50 Ω monitor resistors connected in series with the cathodes, are shown in FIGS. 30(B) and 30(C), respectively, for various control voltages. The transit time of a domain across the cathode and the anode in region (I) is about 20 ns. A current spike in FIG. 30(B) represents a domain generating pulse, and that the current increases slightly when the domain is passing by the bridge portion 41 owing to the wider crosssection. As seen from the current waveforms in region (II) shown in FIG. 30(C), the presence of a high electric field domain in region (II) is observed when the control voltage $V_y$ is negative. With increasing the control voltage $V_y$ the domain potential in region (II) gets smaller: and finally positive value of the control voltage, the domain in region (I) does not spread into region (II), as the current in region (II) remains almost constant during the domain propagation in region (I).

From FIGS. 30(B) and 30(C) it is clear that when the control voltage is higher than a certain value the current in the region (II) disappears showing the inhibiting of the high electric field domain to be spread into the region (II).

Further, the spatial growth of the high electric field domain can also be controlled by irradiating a desired portion of the semiconductor with light or the like. FIG. 31 shows an embodiment using such irradiation in which a light source a such as light emitting element 42 is located adjacent to one surface of the semiconductor 31 and a light emitted from the light emitting element 42 upon an electrical signal irradiates the semiconductor. Carriers are produced in the irradiated area and they act to lower the electric field intensity in that area to thereby inhibiting the lateral growth of the high electric field domain.

Since the spatial growth of high electric field domain can be controlled by electrical signals in the described manners, they have applications in various logic operations or the like at considerably high operation speed.

FIG. 32 shows the basic construction of a bulk semiconductor device adapted to perform logic operations in accordance with the above described principle. The semiconductor per se takes the form of an H-shaped structure and is provided at the respective ends with ohmic electrodes 32, 32' and 33, 33' to which DC voltages are applied. In this arrangement, the electrodes 32 and 32' serve as cathodes to which terminals 34 and 34' are connected respectively and the electrodes 33 and 33' serve as anodes to which terminals 35 and 35' are connected respectively. On the surface of the semiconductor a generating electrode 43 for generating a high electric field domain in the semiconductor 31 by a signal (which may be an ohmic, non-ohmic or capacitive electrode or may be, for example, MOS or Schottky barrier) is provided adjacent to the cathode 32 to which a terminal 34 is connected. In addition, a control electrode 36 is provided in or near the bridge portion 41 between the left side region (I) and the right side region (II) of the H-shaped semiconductor 31 which acts to control the spatial growth of a high electric field domain into region (II) and to which a terminal 37 is connected. An output terminal 39' is connected to the anode 33'.

DC bias voltages are applied between the electrodes 32 and 33 and between the electrodes 32' and 33', respectively, the values being adjusted in such a manner that on terminal 34 they are slightly lower than the threshold voltage at or above which a high electric field domain is generated. Under these conditions, when a signal is applied to the terminal 34 a high electric field domain is generated in the vicinity of the electrode 43. The following are methods for performing various logic operation using this arrangement.

The most fundamental operation of this semiconductor device is to obtain an output z from the output terminal 39 by applying a signal x to the generating terminal 38 and another signal y to the control terminal 37. Upon the application of the signal x to the terminal 38, a high electric field domain is generated in the region (I) of the semiconductor and upon the application of the signal y to the terminal 37 the spatial growth of the domain into the region (II) is inhibited. The relationship between these input signal x, y and output signal z is represented in the truth table in FIG. 32 and this performs a logic operation of $z = x. \sim y$.

Since the above is a modification of Sheffer's stroke, almost all kinds of logic operation can be performed by combining $x. \sim y$.

FIG. 33 shows an example of negation circuit in which a negation of y is obtained as the output if the constant signal of 1 is applied to the electrode 43 as x.

In FIG. 34 a pair of high electric field domain generating electrodes 43 and 43' are provided on the region (I) of the semiconductor in the vicinity of the cathode thereof and the input signals x and y are applied to terminals 38 and 38' connected to the generating electrodes 43 and 43' respectively. In the bridge portion 41 between the regions (I) and (II) are provided a pair of electrodes 36 and 36' for controlling the spatial growth of a high electric field domain, the electrodes 36 and 36' being connected in parallel to the electrodes 43 and 43'.

The electrodes 36 and 36' are located along the spatial growth direction of the domain, for example, as shown in FIG. 34(A) so that when a signal is applied to either of the control electrodes 36 and 36', the inhibition of the spatial growth of high electric field domain from the region (I) to the region (II) does not occur, while when the both electrodes receive signals simultaneously the inhibition effect is obtained.

With this arrangement, when the input signals $x$ and $y$ are applied to the teminals 38 and 38' respectively, the current in the region (II) is changed due to the presence of high electric field domain in the region (II) and the change in current is detected on a detection terminal 39.

The output signal $z$ is as in the truth table in FIG. 34(B), representing logic operation of EXCLUSIVE OR, given by $z = x \oplus y$.

FIG. 35 shows an arrangement which is equivalent to a combination of two of the basic devices shown in FIG. 32, in which the semiconductor comprises regions (I), (II) and (III) and the electrodes 36 and 36' for controlling the spatial growth of high electric field domain are provided at the bridge portions 41 connecting the region. The electrodes 43 and 43' for generating high electric field domains are provided in the vicinities of the cathodes 32 and 32' of the regions (I) and (III) respectively and are connected respectively to the control electrodes 36 and 36' disposed on the bridge portions 41 between the regions (II) and (III) and between the regions (I) and (II) respectively. The input terminals 37 and 37' are led from the connections of the electrodes 43 and 36' and the electrodes 43' and 36 respectively. In this arrangement, the output signal $z$ obtainable at the terminal 39' as the change in current flowing in the region (II) when the input signals $x$ and $y$ are applied to the terminals 37 and 37' respectively becomes as in FIG. 34(B), resulting in an EXCLUSIVE OR logic operation represented by $z = x \oplus y$.

FIG. 36 shows another embodiment similar to that shown in FIG. 33 except that the construction in FIG. 36 includes a pair of control electrodes 36 and 36' which are connected to the terminals 37 and 37' while FIG. 32 shows only a single control electrode 36, (the electrodes 36 and 36' are considered as divided from the single electrode in FIG. 33), and in which a constant input is always applied to the domain generating electrode 43 to maintain a high electric field domain generating. In this arrangement, when an input signal is applied to either of the terminals 37 and 37', the domain growth inhibiting effect does not occur, while only when input signals are applied to the terminals 37 and 37' at the same time is the growth of the high electric field domain from the region (I) to the region (II) of the semiconductor inhibited. Accordingly, in the latter case, there is provided a relation between the input signals $x$ and $y$ applied to the terminals 37 and 37' and the output signal $z$ obtained at the terminal 39' given by $z = \sim(x.y)$ which is a NAND operation.

FIG. 37 shows another embodiment which is similar to that shown in FIG. 36 but different in arrangement of the control electrode 36 and 36' in that the example in FIG. 36 comprises a pair of control electrodes disposed along the spatial growth of a high electric field domain in the bridge portion between the regions (I) and (II) while the example in FIG. 37 comprises a pair of electrodes disposed at right angles to the spatial growth of a high electric field domain in the same portion. In the arrangement in FIG. 37 the spatial growth of a high electric field domain generated in the region (I) to the region (II) is inhibited either when a signal is applied to only one of the terminals 37 and 37' or when signals are applied to both of the terminals 37 and 37' and therefore there is provided a relation between the inputs $x$ and $y$ applied to the terminals 37 and 37' and the output $z$ obtained at the output terminal 39', given by $z = \sim(x \vee y)$ which is a NOR operation.

FIG. 38 is an embodiment which is constructed by modifying the construction in FIG. 33 in such a manner that an additional electrode 43' for generating a high electric field domain is provided in the vicinity of the cathode in the region (II) to obtain an output representing $x$ to $y$ conversion by applying the signal $x$ to the control electrode 36 and the signal $y$ to the electrode 43' and to thereby perform an logic implication operation.

FIGS. 39 and 40 are embodiments constituted with the fundamental arrangement in FIG. 32 to perform and AND operation. In FIG. 39 when a signal $x$ or $y$ is applied, a high electric field domain is generated in the region (I) or (II) and when both of the signals $x$ and $y$ are applied two high electric field domains are generated in both the regions (I) and (II) to increase the output level twice the output under the former condition. When this increased output level is designated by 1 an AND operation can be performed.

The embodiment in FIG. 40 is similar to that shown in FIG. 32 but different in that a signal $\sim y$ is applied beforehand to the terminal 37 to perform an AND operation.

By combining the fundamental arrangements described heretofore for various fundamental logic operations, an adder can be constructed. FIG. 41 is an embodiment of half-adder in which a carry C of the inputs $x$ and in FIG. 41(B).

FIG. 42 is an embodiment of a high speed carry device which is constructed with a plurality of semiconductor regions (I), (II), (III), . . . (N) which number corresponds to the number of digits and is provided with a control electrode for controlling the spatial growth of high electric field domain on each of the bridge portions between the adjacent regions. In FIG. 42 the symbol $S_i$ represents the sum of the ith digit of the half-adder and $\sim S_i$ is a negation signal of $S_i$. The symbol $C_i$ represents a carry in the ith digit of the half-adder. There the presence of a high electric field domain in each region is represented by 1 and the output from the $(i - 1)$th region is represented by $C_{i-1}$, the result of sum in each digit position can be represented as follows:

$$S_i^* = C_{i-1}^* \oplus S_i$$

Since when $C_i$ is 1, $\sim S_i$ is always 1, the high electric field domain never growingly spreads from right to left.

The operation of this device now will be described. As an example it is assumed that the sum of X = 1111 and Y = 1001 is desired. With the half-adder, the sum signal and the carry signal for each digit are as follows

X: 1111
Y: 1001
S: 0110
C: 1001

Explaining this with reference to FIG. 43(A), if it is assumed that a ball representative of a carry $C_1$ passing over recesses $S_2$ and $S_3$ representative of sums, causes the recesses $S_2$ and $S_3$ to disappear, the ball C will enter into recesses $S_4$ and the ball $C_4$ will enter into a recess $S_5$, and consequently the following is obtained.

X: 1111
Y: 1001
answer: 11000

Explaining this with reference to FIG. 42, since $\sim S_2$ and $\sim S_3$ are 0 the domain due to $C_1$ can grow to the regions (II) and (III) of the semiconductor. However, since $\sim S_4$ is 1 the growth of this domain from the region to the right is inhibited. Furthermore, since $C_4$ is 1 a high electric field domain can exist in the region (N). However, since ~S$_5$ is 1 this domain cannot grow toward the region (V). That is, the high electric field domain can exist only in the regions (I), (II), (III) and (IV). It is assumed that the output signals obtained from the respective regions are represented by $C_1'$, $C_2'$, $C_3'$ and $C_4'$. On the other hand, for $S_i$, respective $S_2$ and $S_3$ are 1. Accordingly, $$S_i' = C_{i-1}' \oplus S_i$$

where $S_1' = S_1$
and the relation therebetween becomes as in FIG. 44(B) which is precisely the previous result.

It should be noted that, while in each embodiment described the high electric field domain generating electrode is provided in the vicinity of the cathode in the region (I) of the semiconductor, such a domain generating electrode is not always required in order to generate a high electric field domain by an external signal. For example the high electric field domain can be generated by applying an input signal directly to the cathode or anode to raise the field intensity at that portion higher than the threshold value required to generate a domain. The output, i.e., whether a high electric field domain exists or not, may be detected by providing a high electric field domain detecting electrode as shown in FIG. 12.

In the previous embodiments, the high electric field domain control electrode has been described as having the function of inhibiting the spatial growth of the high electric field domain, that is, the method of use such as shown in FIG. 29(B). It should be noted, however, that substantially the same result can be obtained by utilizing the effect of the promotion of lateral growth of high electric field domain due to the control electrode as in FIG. 29(C). For example, in the construction shown in FIG. 32, the thickness and/or the electrical properties of the semiconductor and/or the DC bias voltage are so selected that the high electric field domain generated in the region (I) is inhibited from growing laterally into the region (II) when no signal is applied to control electrode 36 and permitted to grow into the region (II) when a signal is applied to the control electrode 36. In this case, the relation between the input signals $x$ and $y$ and the output signal $z$ becomes as in the truth table shown in FIG. 44(B), performing an AND operation.

Further, when this method of use is employed in the construction of FIG. 36, an OR operation can be performed and when employed in the construction in FIG. 37 an AND operation is performed. In these embodiments of FIGS. 36 and 37, a steady voltage is applied to the generating electrode 43 to generate a high electric field domain, and two input signals, $x$ and $y$ are applied to the control electrodes, 36 and 36', respectively. In the high speed carry device shown in FIG. 42, since the input signal to be applied to the respective control electrode may be $S_i$ rather than ~$S_i$ when the function of the control electrode is made to promote the spatial growth of the high electric field domain, the construction of the adder is considerably simplified.

An embodiment of the present invention is shown in FIG. 44 in which the generating electrode 43 is provided near the cathode 32 in the region (I) and the Schottky electrode 44 is provided in the bridge portion 41 of the regions. The bias voltages for the respective regions are maintained at slightly lower than the threshold voltage required to generate a high electric field domain therein. The domain in region (I) which is generated upon the application of a trigger signal to the generating electrode 43, travells toward its anode 33. If in this case no signal is applied to the Schottky electrode 44 provided on the bridge portion 41, the domain cannot grow into the region (II) because the field intensity under the gate electrode 43 is low. However, when a negative voltage is applied to the Schottky electrode 44, the high electric field domain in the region (I) grows into the region (II) easily because the electron depletion layer is produced ude to the negative voltage, so that the short-circuit effect due to the metal disappears and thus the field intensity at that portion is increased. Consequently, the regions (I) and (II) have high electric field domains respectively and the respective domains move toward the respective anodes 33, 33'. Accordingly, where the change in current flowing through the region (II) is derived from the terminal 39 as the output $z$, a relation such as shown in FIG. 44(B) is obtained between the output $z$ and the signal $x$ to the generating electrode 43 and the signal $y$ to the control electrode 44, performing an AND operation.

Figure 26:
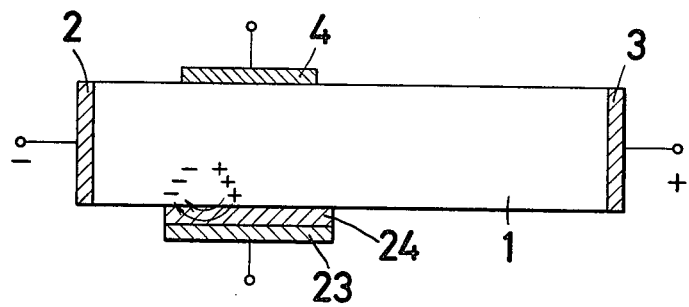
Figure 26:
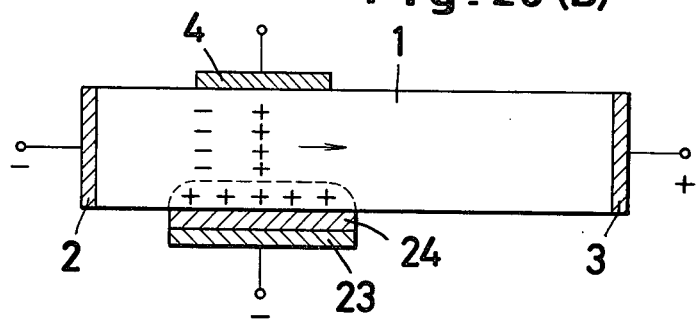

The same function as that of the Schottky electrode in FIG. 26 can be obtained by inserting a resistive layer between the semiconductor and the electrode.

In this embodiment, any method can be employed for generating a high electric field domain and, as examples, it can be generated by applying a negative voltage to the cathode, applying a positive voltage to the ohmic trigger electrode provided near the cathode, applying a negative voltage to a capacitive electrode provided near the cathode.

FIG. 45 shows a modification of the embodiment in FIG. 32 which performs an AND operation wherein the construction shown in FIG. 32 is extended somewhat in the lateral direction to provide a construction which can additionally perform the function of a decoder.

In this example, which is for three bits of information, the high electric field domain generating electrode 43 is provided only the region positioned at the left most end and a high electric field domain generated at the portion grows in lateral direction to reach the right most end and provides an output signal only when its lateral spread is not inhibited by any of the control electrodes 36 provided on the right side relative to the electrode 43. With this arrangement a decoder is realized which derives selectively any desired one of a plurality of bits at a very high speed.

In the embodiments shown in FIGS. 32 to 45, a distance in the longitudinal direction is provided between the generating electrode 43 and the control electrode 36 for convenience of explanation. It should be noted, however, that the operation speed is can be increased by providing the two electrodes adjacently as shown in FIG. 46. That is, the shorter longitudinal distance between the electrodes 36 and 43 provides higher operation speed. It should be further noted that the domain control electrode need not always be provided at the bridge portion 41 between the two regions. It may be provided in the vicinity of that portion with substantially the same effect as shown in FIG. 47.

As described in detail, according to the present invention logic operations or addition can be performed at substantially higher speed than in any conventional semiconductor device by providing a control means on the semiconductor to control the generation of a high electric field domain in the semiconductor.

The present invention makes a substantial contribution to the electronic industry in that it can be produced from such a semiconductor material as GaAs and InP by using integrated circuit technology to prepare an epitaxial layer in the required pattern and thus provides a device which, being of such simpler construction and being capable of performing much more complex function at extremely high speed than heretofore known semiconductor devices, is applicable with great advantages to electronic computers and other information processing machines.

What is claimed is:

1. A bulk semiconductor device comprising in combination, a semiconductor element exhibiting a negative conductivity under a high electric field and being capable of generating a high electric field domain therein, two ohmic electrodes one at either end of said semiconductor element disposed to apply a bias voltage, at least one means for generating a high electric field domain in said semiconductor element by means applying an input signal to increase the electrical field in a region adjacent the generating means, at least one means for inhibiting the generation of a high electric field domain in said semiconductor element by means applying another input signal to increase the electric field in a region adjacent the inhibiting means, and means for detecting the existence of the high electric field domain in said semiconductor element to produce an output signal.

2. The bulk semiconductor device according to claim 1, wherein said at least one means for inhibiting the generation of a high electric field domain is a field effect type electrode.

3. The bulk semiconductor device according to claim 2, wherein number of said field effect type electrodes is two.

4. The bulk semiconductor device according to claim 1, wherein said at least one means for inhibiting the generation of a high electric field domain is a light emitting diode.

5. The bulk semiconductor device according to claim 4, wherein the number of said light emitting diodes is two.

6. The bulk semiconductor device according to claim 1, wherein said semiconductor element has a part which is greater in cross sectional area than other parts thereof and said inhibiting means is provided at said part.

7. The bulk semiconductor device according to claim 2, wherein said field effect type electrode is a capacitive electrode.

8. The bulk semiconductor device according to claim 2, wherein said field effect type electrode is a Schottky electrode.

9. The bulk semiconductor device according to claim 2, wherein said field effect type electrode is a resistive layer with metal.

10. The bulk semiconductor device according to claim 1, wherein the number of said generating means is two and the number of said inhibiting means is two, each of said generating means being associated with a specific one of said inhibiting means and being electrically connected to the one of said inhibiting means with which it is not associated.

11. The bulk semiconductor device according to claim 1 wherein said at least one means for inhibiting the generation of a high electric field domain is a resistive layer with metal.

12. A bulk semiconductor device comprising in combination a semiconductor element exhibiting a negative conductivity under a high electric field and being capable of generating a high electric field domain therein, two ohmic electrodes one at either end of said semiconductor element to apply a bias voltage, two field effect type electrodes provided on said semiconductor element, and means for applying input signals to each of said field effect type electrodes, whereby the generation of a high electric field domain in said semiconductor element is inhibited when input signals are applied to both of said field effect type electrodes and a high electric field domain is generated in said semiconductor element when an input signal is applied to either one but not both of said field effect type electrodes, and means for detecting the existence of the high field domain in said semiconductor element to produce an output signal.

13. A bulk semiconductor device according to claim 12, wherein said field effect type electrodes are provided on the same surface of said semiconductor element spaced longitudinally of its length.

* * * * *